US009095016B2

(12) United States Patent
Kwack et al.

(10) Patent No.: US 9,095,016 B2
(45) Date of Patent: Jul. 28, 2015

(54) ORGANIC LIGHT EMITTING DIODE DISPLAY

(75) Inventors: Jin-Ho Kwack, Yongin (KR); Dong-Won Han, Yongin (KR); Min-Chul Suh, Yongin (KR); Hyo-Jin Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 431 days.

(21) Appl. No.: 12/702,906

(22) Filed: Feb. 9, 2010

(65) Prior Publication Data

US 2010/0201261 A1    Aug. 12, 2010

(30) Foreign Application Priority Data

Feb. 9, 2009    (KR) .................. 10-2009-0010099

(51) Int. Cl.
H01J 1/62 (2006.01)
H05B 33/04 (2006.01)
H01L 51/52 (2006.01)

(52) U.S. Cl.
CPC ............ H05B 33/04 (2013.01); H01L 51/5237 (2013.01)

(58) Field of Classification Search
CPC .......................... H01L 51/5237; H05B 33/04
USPC ........................................................ 313/512
See application file for complete search history.

(56) References Cited

U.S. PATENT DOCUMENTS 7,323,817 B2 *   1/2008  Shitagami et al. ............ 313/512
2005/0269926 A1 * 12/2005  Fukuoka et al. ............... 313/123

FOREIGN PATENT DOCUMENTS

| JP | 2003-142257 | 5/2003 |
| KR | 10-2005-0011009 | 1/2005 |
| KR | 10-2006-0000747 | 1/2006 |
| KR | 10-2006-0023652 | 3/2006 |
| KR | 10-2006-0058304 | 5/2006 |
| KR | 10-0873704 | 12/2008 |

OTHER PUBLICATIONS

Machine translation of KR 100873704.*

* cited by examiner

*Primary Examiner* — Nimeshkumar Patel
*Assistant Examiner* — Jacob R Stern
(74) *Attorney, Agent, or Firm* — Knobbe Martens Olson & Bear LLP (57) ABSTRACT

An OLED display includes a substrate on which OLEDs are formed, a TFE layer formed on the substrate so as to cover the OLEDs, and absorbers disposed at a distance from each other and preventing or inhibiting penetration of external foreign materials.

13 Claims, 6 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2009-0010099 filed in the Korean Intellectual Property Office on Feb. 9, 2009, the disclosure of which is incorporated herein by reference in its entirety.

BACKGROUND

1. Field

The present disclosure relates to an organic light emitting diode (OLED) display. More particularly, it relates to an OLED display with application of a thin film encapsulation (TFE) structure.

2. Description of the Related Technology

An organic light emitting diode (OLED) display typically includes a plurality of OLEDs formed of a hole injection electrode, an organic emission layer, and an electron injection electrode. Each OLED can emit light by energy from excitons generated when electrons and holes that are combined drop from an excited state to a ground state, and the OLED display displays an image by using the light.

Accordingly, the OLED display has self-luminance characteristics, and unlike a liquid crystal display (LCD), its thickness and weight can be reduced since a separate light source is not required. Further, because the OLED display has certain desirable characteristics such as low power consumption, high luminance, and high reaction speed, the OLED display may be suitable for use in a mobile electronic device.

The OLED may be deteriorated due to internal and external factors. With the internal factors, the organic emissive layer may be deteriorated under the atmosphere of oxygen if indium tin oxide (ITO) is the electrode material, or under the interfacial reaction between organic layer components of the organic emissive layer. The external factors may include external moisture and oxygen, and ultraviolet rays. In particular, because the external oxygen and moisture can influence the life span of the OLED, it is very important to package the OLED such that it is sealed from the outside in a vacuum tight manner.

A thin film encapsulation (TFE) technique may be introduced in packaging the organic light emitting diode, which is well known to those skilled in the art. With the thin film encapsulation technique, one or more of inorganic and organic layers can be alternately stacked on the OLEDS formed at the display area of the substrate, thereby covering the display area with a TFE layer. For an OLED display with such a TFE layer, a substrate formed with a flexible film can be bent easily, and can be advantageous in forming a slim structure.

However, a typical TFE layer can have a weak edge compared to a center portion, such that external moisture and oxygen can penetrate through the edge of the TFE layer. That is, the external moisture and oxygen may penetrate through a side of an externally exposed organic layer or an interface between an inorganic layer and an organic layer. Accordingly, the OLEDs disposed at the edge of the display area can be deteriorated such that display failures may occur.

The above disclosure is only provided to enhance understanding of the background and does not necessarily reflect prior art that was known to a person of ordinary skill in the art.

SUMMARY

Embodiments of the invention provide OLED displays that can prevent or reduce deterioration of OLEDs by inhibiting penetration of external moisture and oxygen into a TFE layer.

An OLED display according to an exemplary embodiment of the present invention includes a substrate on which OLEDs are formed, a thin film encapsulation (TFE) layer formed on the substrate while covering the OLEDs, and absorbers disposed at a distance from each other inside the TFE layer and inhibiting penetration of external foreign materials.

The substrate may include a display area where the OLEDs are provided, and the absorbers may be disposed outside the display area.

The absorbers may be disposed to form at least one row along the edge of the display area. In this case, the absorbers may be disposed at a constant distance from each other.

On the other hand, the absorbers may be formed at random in an irregular pattern along the edge of the display area.

The absorbers may be formed as a dot shape.

The TFE layer may include a plurality of inorganic layers and a plurality of organic layers, and the inorganic layers and the organic layers may be alternately stacked.

The absorbers may be disposed on a bottom surface of at least one of the plurality of inorganic layers, or may be disposed on a bottom surface of at least one of the plurality of organic layers.

On the other hand, the absorbers may be disposed on a bottom surface of at least one of the plurality of inorganic layers and a bottom of at least one of the plurality of organic layers.

The absorbers may be made of at least one selected from a group of calcium, calcium oxide, barium oxide, aluminum, aluminum oxide, magnesium, and magnesium oxide.

According to embodiments of the invention, penetration of foreign material can be inhibited by the TFE layer in the OLED display, and the external foreign material entered in the TFE layer can be absorbed by the absorbers. Accordingly, deterioration of OLEDs can be prevented or reduced.

Accordingly, OLED displays according to embodiments of the invention can minimize display failures and increase durability and life-span.

DETAILED DESCRIPTION OF THE EMBODIMENTS

The present disclosure will be described more fully hereinafter with reference to the accompanying drawings, in which exemplary embodiments are shown. As those skilled in the art would realize, the described embodiments may be modified in various different ways, all without departing from the spirit or scope of the invention.

Figure 1:
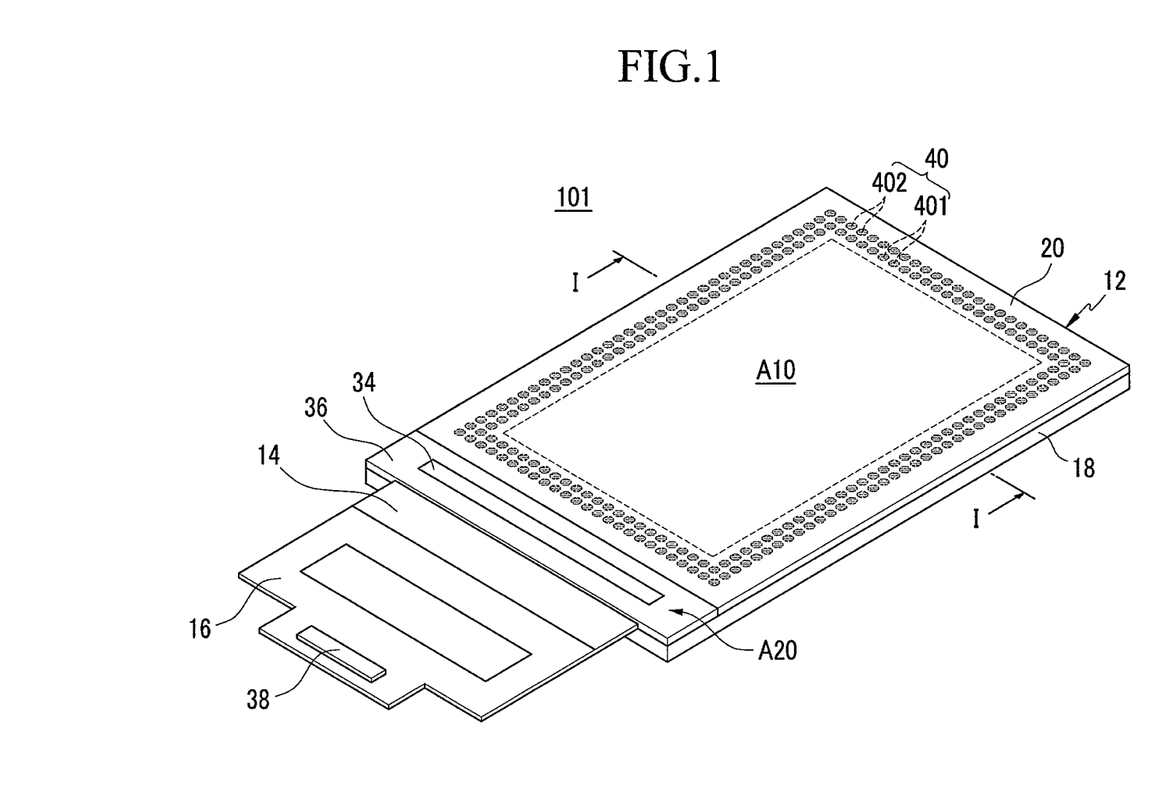
FIG. 1 is a perspective view of an OLED display according to a first embodiment of the invention.
Figure 2:
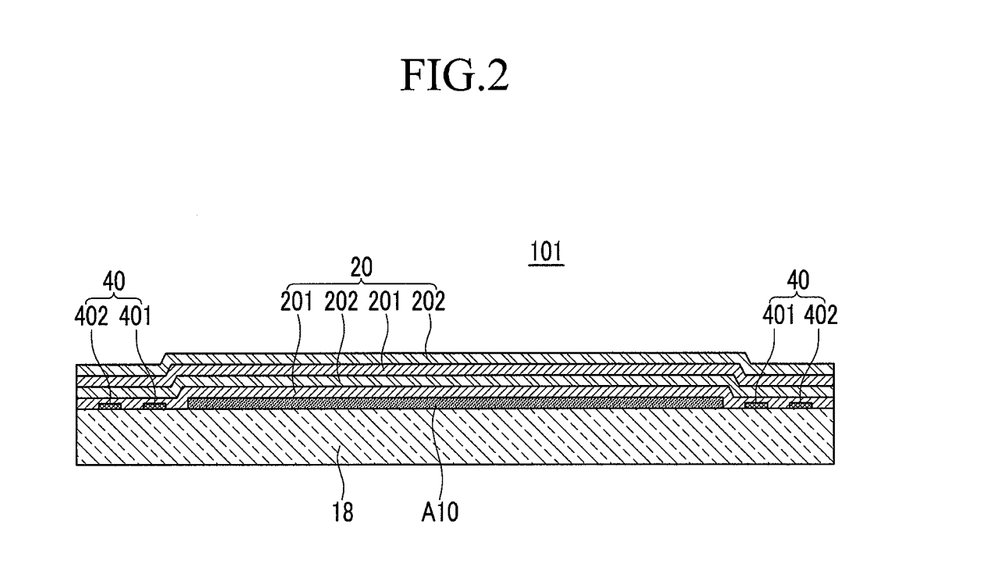
FIG. 2 is a cross-sectional view of FIG. 1, taken along the line I-I.

FIG. 1 is a perspective view of an organic light emitting diode (OLED) display according to a first embodiment of the invention, and FIG. 2 is a cross-sectional view of FIG. 1, taken along the line I-I.

Referring to FIG. 1 and FIG. 2, an OLED display 101 according to the illustrated embodiment can include a panel assembly 12 and a printed circuit board 16. The panel assembly 12 typically has a display area A10 and a pad area A20, and displays a predetermined image in the display area A10. The printed circuit board 16 is typically electrically connected to the panel assembly 12 through a flexible circuit board 14.

The panel assembly 12 can include a substrate 18 having the display area A10 and the pad area A20 defined on an upper surface thereof and a thin film encapsulation (TFE) layer 20 formed on the substrate 18, covering the display area A10. The TFE layer 20 can be formed larger than the display area A10 so that it covers not only the display area A10 but also the upper surface of the substrate 18 outside of the display area A10 for protection. The pad area A20 can be exposed rather than being covered by the TFE layer 20.

A plurality of sub-pixels can be arranged in a matrix format in the display area A10 of the substrate 18, and a scan driver (not shown) and a data driver (not shown) for driving the sub-pixels are provided outside the display area A10. A plurality of pad electrodes (not shown) can be provided in the pad area A20 of the substrate 18 for transmitting an electric signal to the scan driver and the data driver.

Figure 3:
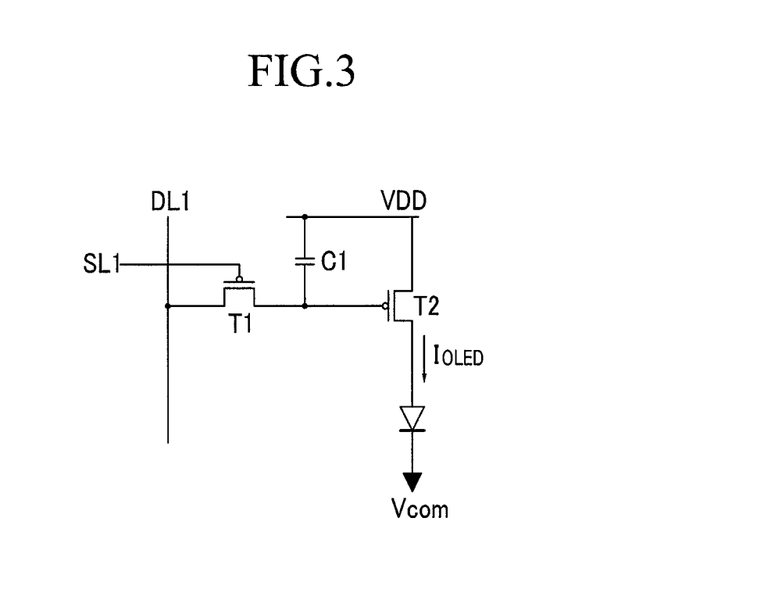
FIG. 3 is a schematic diagram of a sub-pixel circuit structure of a panel assembly of FIG. 1.
Figure 4:
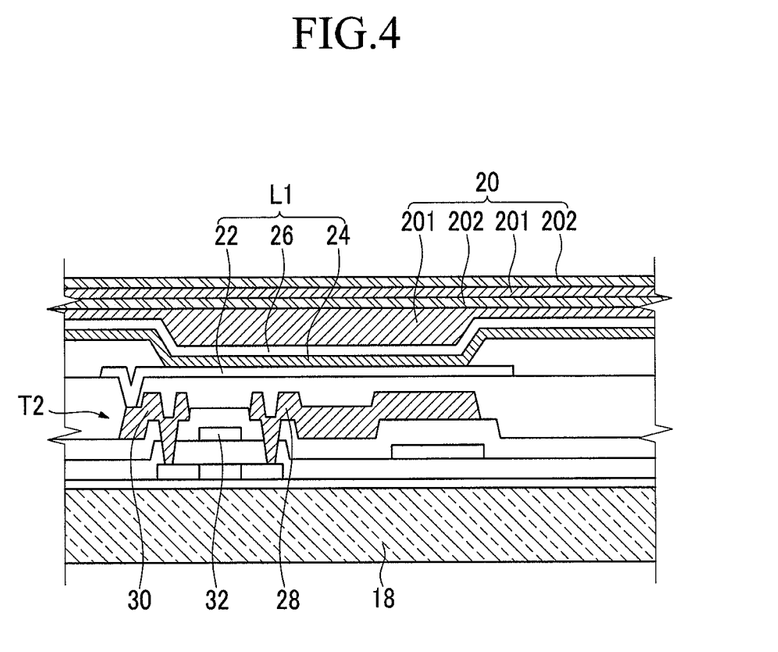
FIG. 4 is a partial cross-sectional view of the panel assembly of FIG. 1.

FIG. 3 is a schematic view of a sub-pixel circuit structure of the panel assemble of FIG. 1, and FIG. 4 is a partially enlarged cross-sectional view of the panel assembly of FIG. 1.

Referring to FIG. 3 and FIG. 4, a sub-pixel of the panel assembly 12 can be formed of an OLED L1 and a driving circuit unit. The OLED L1 can include an anode (hole injection electrode) 22, an organic emission layer 24, and a cathode (electron injection electrode) 26.

The organic emission layer 24 may further include an emission layer (not shown) that substantially emits light and organic layers (not shown) for efficient transmission of holes or electrons to the emission layer. The organic emission layer 24 may include at least one of a hole injection layer (HIL) and a hole transport layer (HTL) interposed between the anode 22 and the emission layer, and an electron injection layer (EIL) and an electron transport layer (ETL) interposed between the cathode 26 and the emission layer.

Referring to FIG. 3, the driving circuit unit can include at least two thin film transistors T1 and T2 and at least one storage capacitor C1. The thin film transistors typically include a switching transistor T1 and a driving transistor T2.

The switching transistor T1 can be connected to a scan line SL1 and a data line DL1, and can transmit a data voltage input from the data line DL1 according to a switching voltage input to the scan line SL1 to the driving transistor T2. The storage capacitor C1 can be connected to the switching transistor T1 and a power source line VDD, and can store a voltage that corresponds to a difference between a voltage transmitted from the switching transistor T1 and a voltage supplied to the power source line VDD.

The driving transistor T2 can be connected to the power source line VDD and the storage capacitor C1 and supplies an output current $I_{OELD}$ that is proportional to the square of a difference between the voltage stored in the storage capacitor C1 and a threshold voltage to the OLED L1, and the OLED L1 can emit light by the output current $I_{OLED}$. The driving transistor T2 can include a source electrode 28, a drain electrode 30, and a gate electrode 32, and the anode 22 of the OLED L1 may not be connected to, the drain electrode 30 of the driving transistor T2. The configuration of the sub-pixel is not limited thereto, and may be variously modified.

Referring to FIG. 2 and FIG. 4, the TFE layer 20 can be formed directly on the OLEDs and driving circuit units can be formed on the substrate 18 to seal the OLEDs and the driving circuit units from the external environment for protection.

The TFE layer 20 can be formed on two or more inorganic layers 201, and two or more organic layers 202, and the inorganic layers 201 and the organic layers 202 can be alternately stacked. In FIG. 2 and FIG. 4, the TFE layer 20 can be formed, for example, of two alternately stacked inorganic layers 201 and two organic layers 202.

The inorganic layer 201 may be made of aluminum oxide or silicon, and the organic layer 202 may be made of epoxy, acrylate, and urethane acrylate. The inorganic layer 201 can reduce or suppress penetration of external moisture and oxygen, and the organic layer 202 can ease internal stress of the inorganic layer 201 or fill micro-cracks and pinholes of the inorganic layer 201.

Referring back to FIG. 1 and FIG. 2, an integrated circuit (IC) chip 34 and a flexible circuit board 14 can be mounted on the pad area A20 of the panel assembly 12 by respectively using a chip-on-glass (COG) method and a chip-on-film (COF) method. A protective layer 36 can be formed around the IC chip 34 and the flexible circuit board 14 to cover pad electrodes formed in the pad area A20 for protection. In the flexible circuit board 16, electrons are typically provided for processing driving signals and a connector 38 is provide for transmitting an external signal to the flexible circuit board 16.

In a rear side of the panel assembly 12, a buffering tape (not shown) or a bezel (not shown) may be provided for increasing internal impact intensity of the panel assembly 12. The flexible circuit board 14 may be fixed to the pad area A20 and bent to the rear side of the panel assembly 12 to make the printed circuit board 16 face the rear side of the panel assembly 12.

In the illustrated embodiment, the TFE layer 20 can include absorbers 40 that absorb foreign materials such as moisture and oxygen. Thus, in one embodiment the absorbers include materials that can react with moisture and/or oxygen. For example, the absorbers 40 may include or be entirely formed of a metal or an inorganic material that reacts with moisture and oxygen. For example, the metal or inorganic material of the absorbers 40 may be selected from a group of calcium, calcium oxide, barium oxide, aluminum, aluminum oxide, magnesium, and magnesium oxide.

Although the TFE layer 20 may itself inhibit penetration of external moisture and oxygen, foreign materials may still enter inside the TFE layer 20 through an externally exposed edge of the TFE layer 20. In this case, the absorbers 40 can absorb foreign materials that have entered inside the TFE layer 20 to prevent or reduce deterioration of the OLED. Thus, in one embodiment, the absorbers 40 may surround the display area A10 so as to absorb foreign materials entering through the exposed edge of the TFE layer 20.

The absorbers 40 may be separated by a distance from each other, that is, they may be formed in a pattern of individual members that are separated from each other rather than in a line to maximize a surface area for increasing the absorbing function of the foreign materials. Thus, for example, each absorber 40 may be formed as a short bar shape or a dot, of which the width and the length may be the same, or other various shapes. In FIG. 1 and FIG. 2, the absorber 40 may for example be formed as a dot shape. The dot-shaped absorber 40 can maximize the surface size thereof. The width of the absorber 40 may be less than 5 mm. When this condition is satisfied, excessive extension of the width of an external dead space of the display area A10 can be avoided.

The absorbers 40 may be formed on a bottom surface of one inorganic layer 201, for example, a bottom surface of an inorganic layer 210 positioned in the lowest portion of the TFE layer 20. For example, the absorbers 40 may be formed on an upper surface of the substrate 18.

The absorbers 40 may be disposed at a distance from each other, and each of the absorbers 40 may be disposed at an intended position so that the absorbers 40 can form a specific pattern. In one particular example, the absorbers 40 may form at least one row that surrounds the display area A10.

In FIG. 1 and FIG. 2, the first absorbers 401 for example form an inner row along the edge of the display area A10, and second absorbers 402 form an outer row along the edge of the display area A10 outside of the first absorbers 401. In this case, the absorbers 40 absorb the foreign materials having entered from the edge of the TFE layer 20 through two steps so that the foreign material can be effectively eliminated.

Through the above-described configuration, in the OLED display 101 according to an embodiment, penetration of foreign material can be inhibited by the TFE layer 20 and the foreign material having entered in the TFE layer 20 can be absorbed by the absorbers 40. Accordingly, deterioration of OLEDs and display failures can be minimized.

Figure 5:
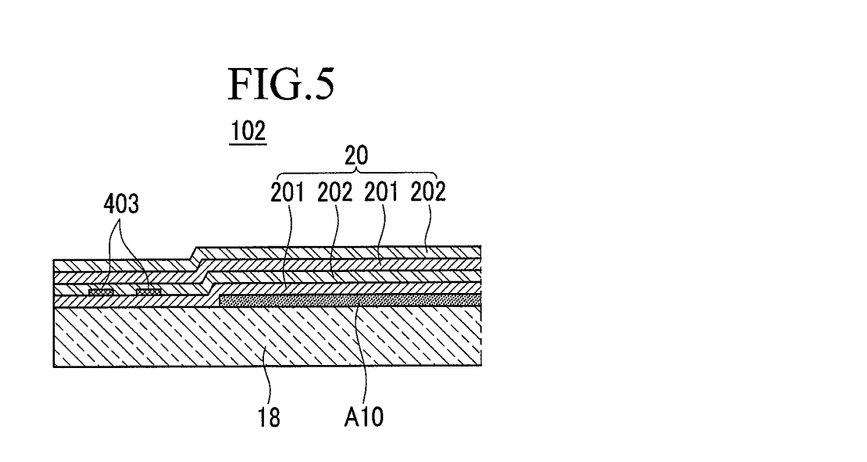
FIG. 5 is a partially enlarged cross-sectional view of an OLED display according to a second embodiment of the invention.

FIG. 5 is a partially enlarged cross-sectional view of an OLED display according to a second embodiment of the invention.

Referring to FIG. 5, an OLED display 102 according to the illustrated embodiment can have the same configuration as the OLED display of the first described embodiment, except that absorbers 403 may be formed on a bottom surface of one of an organic layer 202 among a plurality of organic layers 202. That is, the absorbers 403 may be formed on an upper surface of an inorganic layer 201. Like reference numerals are used for like elements of the first described embodiment.

Figure 6:
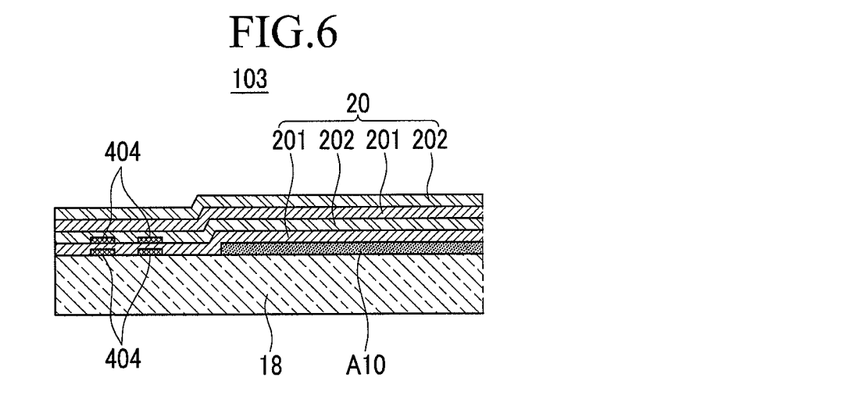
FIG. 6 is a partially enlarged cross-sectional view of an OLED display according to a third embodiment of the invention.

FIG. 6 is a partially enlarged cross-sectional view of an OLED display according to a third embodiment of the invention.

Referring to FIG. 6, an OLED display 103 according to the illustrated embodiment has the same configuration as the OLED display of the first described embodiment, except that absorbers 404 may be formed on a bottom surface of one of a plurality of inorganic layers 201 and on a bottom surface of one of a plurality of organic layers 202. Like reference numerals are used for like elements of the first described embodiment.

Figure 7:
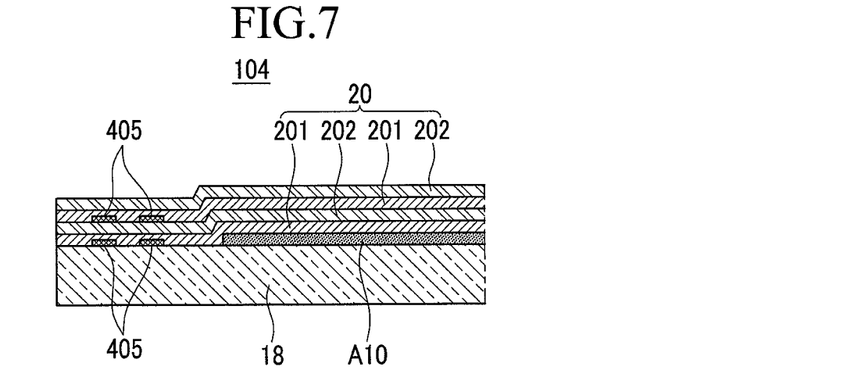
FIG. 7 is a partially enlarged cross-sectional view of an OLED display according to a fourth embodiment of the invention.

FIG. 7 is a partially enlarged cross-sectional view of an OLED display according to a fourth embodiment of the invention.

Referring to FIG. 7, an OLED display 104 according to the illustrated embodiment has the same configuration as the OLED display of the first described embodiment, except that absorbers 405 may be formed on bottom surfaces of a plurality of inorganic layers 201. Like reference numerals are used for like elements of the first described embodiment.

Figure 8:
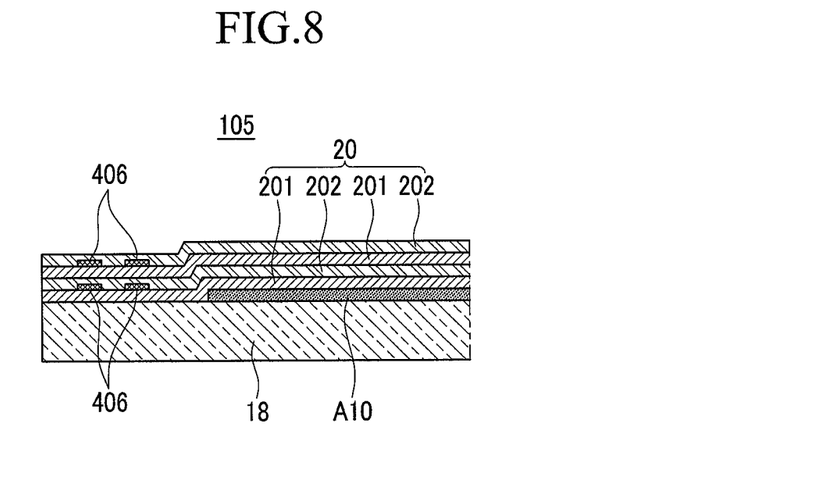
FIG. 8 is a partially enlarged cross-sectional view of an OLED display according to a fifth embodiment of the invention.

FIG. 8 is a partially enlarged cross-sectional view of an OLED display according to a fifth embodiment of the invention.

Referring to FIG. 8, an OLED display 105 according to the illustrated embodiment has the same configuration as the OLED display of the fourth described embodiment, except that absorbers 406 may be formed on bottom surfaces of a plurality of organic layers 202. Like reference numerals are used for like elements of the fourth described embodiment.

Figure 9:
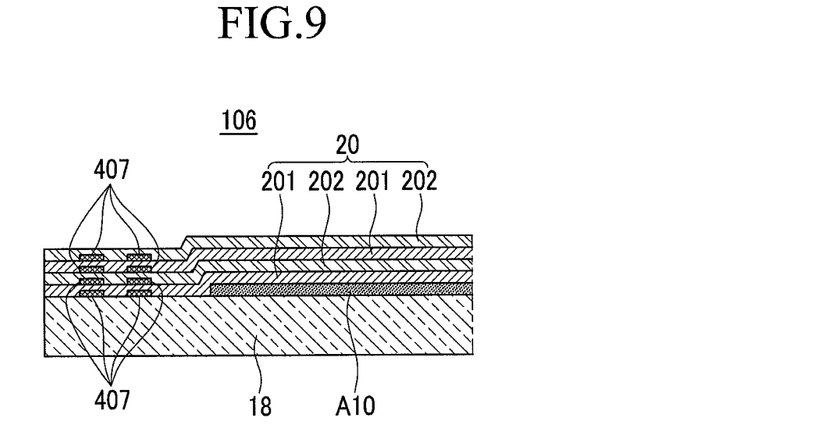
FIG. 9 is a partially enlarged cross-sectional view of an OLED display according to sixth embodiment of the invention.

FIG. 9 is a partially enlarged cross-sectional view of an OLED display according to a sixth embodiment of the invention.

Referring to FIG. 9, an OLED display 106 according to the illustrated embodiment has the same configuration as the OLED display of the fourth described embodiment, except that absorbers 407 may be formed on bottom surfaces of a plurality of organic layers 202 and on bottom surfaces of a plurality of inorganic layers 201. Like reference numerals are used for like elements of the fourth described embodiment.

As the number of inorganic layers 201 and organic layers 202 that form the TFE layer 20 and the number of absorbers 405, 406, and 407 are increased, penetration of foreign materials to the OLEDs can be effectively inhibited.

Figure 10:
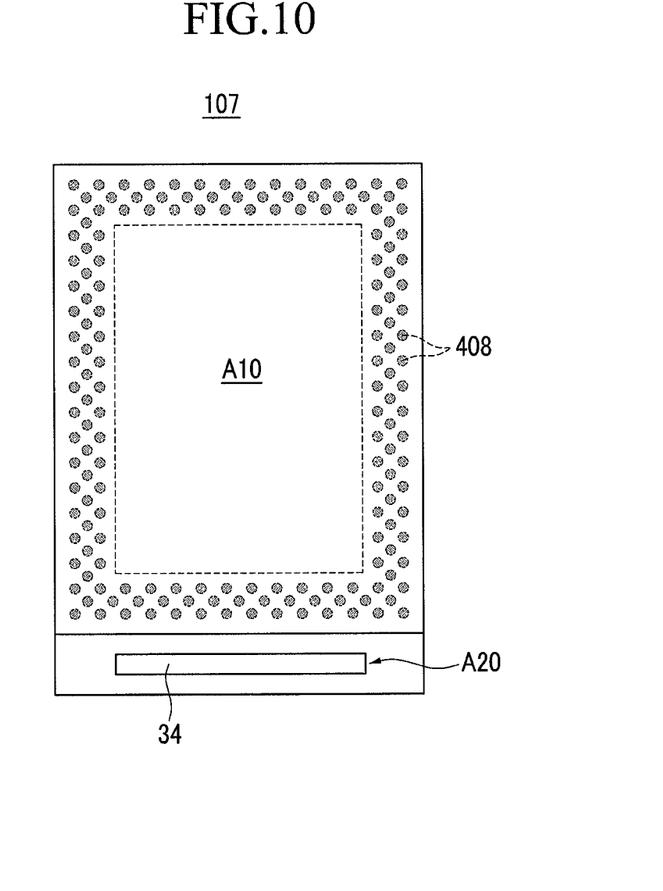
FIG. 10 is a schematic top plan view of an OLED display according to a seventh embodiment of the invention.

FIG. 10 is a top plan view of an OLED display according to a seventh embodiment of the invention.

Referring to FIG. 10, an OLED display 107 according to the illustrated embodiment has the same configuration as the OLED display of one of the first to sixth described embodiments, except that absorbers 408 may be formed at random in an irregular pattern along the edge of a display area A10. As described, when the absorbers 408 are formed in the irregular pattern, precise consideration of an alignment characteristic of the absorbers 408 is not necessary during a manufacturing process so that the process can be simple and easy.

While the invention has been described in connection with certain embodiments, it is to be understood that the invention is not limited to the disclosed embodiments, but is intended to cover various modifications and equivalent arrangements included within the spirit and scope of the appended claims.

What is claimed is:

1. An organic light emitting diode (OLED) display comprising:
    a substrate comprising a display area;
    an OLED formed over the substrate;
    a thin film encapsulation (TFE) layer formed over the substrate and over the OLED, wherein the TFE layer comprises a plurality of inorganic layers and a plurality of organic layers, and wherein the inorganic layers and the organic layers are alternately stacked; and
    a plurality of absorbers arranged at a distance from each other within the TFE layer, wherein the plurality of absorbers are disposed outside the display area, wherein each individual absorber is separated from each other in at least one row along an edge of the display area, and the absorbers are formed as a dot shape, and wherein the at least one row includes the plurality of absorbers and the plurality of absorbers comprises at least one selected from calcium, calcium oxide, barium oxide, aluminum, aluminum oxide, magnesium, and magnesium oxide and wherein the plurality of absorbers directly contact the thin film encapsulation layer.

2. The OLED display of claim 1, wherein the absorbers are disposed along each edge of the display area.

3. The OLED display of claim 1, wherein the absorbers are arranged at a constant distance from each other.

4. The OLED display of claim 1, wherein the absorbers are disposed on a bottom surface of at least one of the plurality of inorganic layers.

5. The OLED display of claim 1, wherein the absorbers are disposed on a bottom surface of at least one of the plurality of organic layers.

6. The OLED display of claim 1, wherein the absorbers are disposed on a bottom surface of at least one of the plurality of inorganic layers and on a bottom surface of at least one of the plurality of organic layers.

7. The OLED display of claim 1, wherein the absorbers comprise a metal or an inorganic material that reacts with moisture and oxygen.

8. An organic light emitting diode (OLED) display comprising:
   a substrate;
   an OLED over the substrate and within a display area;
   a thin film encapsulation (TFE) layer, wherein the TFE layer comprises a plurality of inorganic layers and a plurality of organic layers; and
   a plurality of absorbers along each edge of the display area, wherein each individual absorber is separated from each other in at least one row along each edge of the display area, and the absorbers are formed as a dot shape, wherein the plurality of absorbers are disposed outside the display area and the plurality of absorbers comprises at least one selected from calcium, calcium oxide, barium oxide, aluminum, aluminum oxide, magnesium, and magnesium oxide and wherein the plurality of absorbers directly contact the thin film encapsulation layer.

9. The OLED display of claim 8, wherein the absorbers are disposed on at least one of the organic layers.

10. The OLED display of claim 9, wherein the TFE layer comprises a plurality of layers and the absorbers are disposed on at least one of the inorganic layers.

11. The OLED display of claim 10, wherein the absorbers are disposed on more than one of the layers.

12. The OLED display of claim 8, wherein the absorbers are circular in shape.

13. The OLED display of claim 8, wherein the absorbers are randomly arranged in an irregular pattern.

\* \* \* \* \*